*INVENTOR.*
CARL O. PINGRY, III
BY Ralph C. Dastin
ATTORNEY.

United States Patent Office 3,087,076
Patented Apr. 23, 1963

3,087,076

LOGIC AND/OR GATE HAVING MAGNETICALLY INDUCED PULSES AS ONE INPUT

Carl O. Pingry III, Lexington, Ky., assignor to International Business Machines Corporation, New York, N.Y., a corporation of New York Filed Oct. 10, 1960, Ser. No. 61,499
5 Claims. (Cl. 307—88.5)

The invention relates to transistor switching circuits and more particularly to a system for selectively performing an "and" function from two input pulses while, at the same time, providing an "or" function of several of these "and" functions.

What has been discovered is a novel switching circuit capable of performing the above functions and, by virtue of its technique, is less complex and more reliable than circuits heretofore used, of fewer components and thus more economical, and finally more simple to construct and service.

Accordingly, it is the primary object of this invention to provide a novel transistor switching circuit.

Another object of this invention is to provide an improved logical building block circuit.

A further object of this invention is to provide a transistor logical switching network comprised of a plurality of identical logical building block circuits capable of performing "and/or" functions.

The foregoing and other objects, features, and advantages of the invention will be apparent from the following more particular description of a preferred embodiment of the invention, as illustrated with accompanying drawings.

Figure 1:
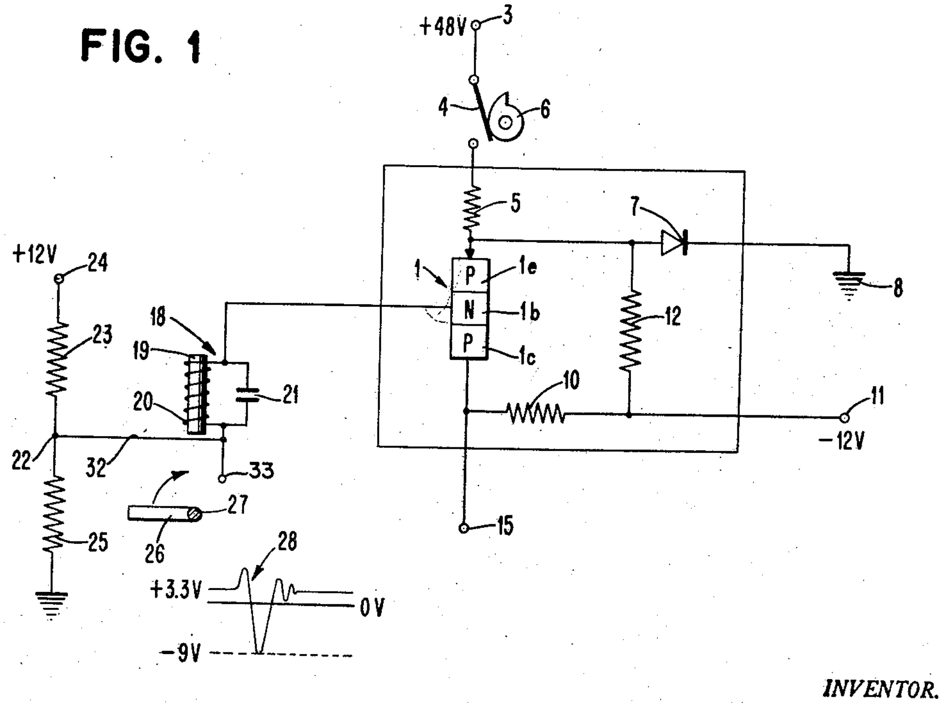
FIG. 1 illustrates a preferred embodiment of the circuitry suitable for the logical block circuit of the invention.

There is illustrated in FIG. 1 of the drawings a circuit utilizing a transistor 1 particularly adapted to the use of the invention. Transistor 1 has an emitter region 1*e*, a base region 1*b*, and a collector region 1*c*. Transistor 1 is shown for illustration purposes as a PNP type. It should be understood that a NPN type of transistor may be substituted with proper circuit and polarity changes, such as could readily be performed by one skilled in the art. A positive potential first input data source 3 is connected through a switch 4, and a resistor 5 to supply a bias potential to the emitter 1*e*. Switch 4 may be closed by a mechanical element, such as cam 6, which may form part of any key actuated machine. The emitter 1*e* is also tied through a diode 7 to a reference potential or to ground 8. The collector 1*c* is connected through a resistor 10 to a negative potential source 11, and the emitter 1*e* is connected to the potential source 11 through a resistor 12. Output terminal 15 is connected directly to the collector 1*c*. Magnetic input signals are impressed on the base 1*b* by a pulses generator 18, which consists of a permanent magnetized element 19 surrounded by turns 20 of a wire which is connected across a condenser 21. A point on the wire between one end of the turns and the condenser is connected to the base 1*b* while another point between the other end of the turns and the condenser is connected through a junction point 22 and a resistor 23 to a positive potential source 24.

Junction 22 is also connected through a resistor 25 to ground. By these connections, junction 22 is biased at a positive voltage approximately equal to the desired negative clipping level of the transistor 1. Associated with the magnet 19 is an arm 26 connected at one end to a rotating shaft 27 and having at least a portion of its free end made of magnetic material. As the outer end of the arm 26 moves under the magnet 19, a pulse 28 is generated. If desired, the arm 26 may be a permanent magnet while each of the elements 19 is made of magnetic material.

In order to facilitate an understanding of the operation of the circuit of this invention, the following set of actual values for the elements of the figure are presented. It should be understood that the principle of operation of this circuit may be present in circuits having a wide range of individual specifications so that the list of values here presented should not be construed as a limitation.

| | |
|---|---|
| Transistor 1 | Germanium alloy junction PNP, for example, TI type 2N1305. |
| Capacitor 21 | .082 microfarad. |
| Resistor 5 | 4.7K ohms. |
| Resistor 10 | 2K ohms. |
| Resistor 12 | 10K ohms. |
| Resistor 23 | 2,700 ohms. |
| Resistor 25 | 1,000 ohms. |
| Diode 7 | Germanium junction, for example, Sylvania type IN571. |
| Potential source 3 | +48 volts. |
| Potential source 11 | −12 volts. |
| Potential source 24 | +12 volts. |

For convenience in the ensuing explanation, the output of the transistor in the off condition will be termed the negative level and will be indicative of a logical zero, while the output during its conducting time will be termed the positive or ground level and will be indicative of a logical one.

Under the above set of conditions, with switch 4 in the open or the logical zero position, the emitter 1*e* will be held at −12 volts by the 10K ohm resistor 12. The collector 1*c* and the output junction 15 will also be held at the potential of the negative source 11 by the 2K ohm resistor 10. With no pulse generated, both sides of the pulse generator will be at +3.3 volts and both junctions 1*eb* and 1*bc* of the transistor 1 will be reverse biased. Since the transistor 1 is inoperative, there will be no output or a "0" output produced at the output junction 15.

Under the foregoing condition of having the switch 4 open, assume that a pulse 28 is generated. Since the switch 4 is still open, the emitter 1*e* will continue to be held negative by the 10K ohm resistor 12. The base 1*b* will follow the generated pulse 28; however, since both junctions 1*eb* and 1*bc* are still reverse biased, the transistor will continue to remain inoperative or in a logical zero output state.

Assume that switch 4 is now in its logical "1" position or closed. With switch 4 closed, the emitter 1*e* will be clamped at ground potential by diode 7. The base 1*b* will continue to be at +3.3 volts while the collector 1*c* will remain at −12 volts. With the emitter 1*e* clamped at ground potential, the junction 1*eb* is now reversed biased by +3.3 volts instead of the previous +15.3 v. We can now say that the transistor is primed or conditioned for operation as a result of the change in the reverse bias. Junction 1*bc* is still reverse biased. Under these conditions, the transistor 1 is still in operative and we have a logical zero output at output terminal 15.

Under the foregoing condition of having the transistor 1 primed or conditioned for operation, assume that the pulse 28 is generated. When the pulse 28 starts to go negative, the emitter 1*e* will see an open circuit until the potential at base 1*b* is brought down to that of the emitter 1e which is clamped to ground potential. As the base 1b is driven further negative, it will draw current and the transistor 1 will be driven to saturation. When the pulse 28 causes the transistor 1 to saturate, a positive pulse appears at the output terminal 15 or we can say that a logical "1" output is produced at the output terminal 15. At saturation, the transistor 1 is operative and both junctions 1eb and 1bc are forward biased.

Before saturation, the impedance of the base 1b was quite high. After saturation, however, the base impedance of the transistor is now very low with respect to the impedance at junction 22. This change in impedance causes a positive voltage pulse to appear at the back side of the pulse generator or at junction 22. This positive pulse is the cut-off portion of the pulse 28 but is reversed in polarity. It can also be described as the portion of the pulse 28 beyond the clipping level.

Figure 2:
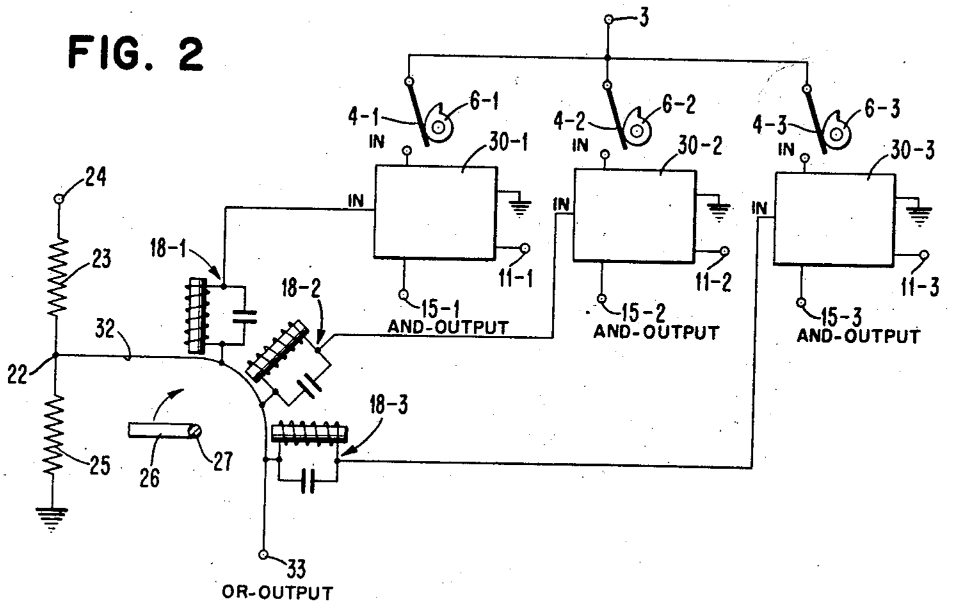
FIG. 2 is a schematic representation of the interconnection of the individual logical block circuits to perform "and/or" functions.

As shown in FIGURE 2, several of the logic blocks described above are connected together at junction 22 with one common biasing arrangement. Therefore, the "or" function of all the individual logic block circuit outputs will appear at this point. The interconnection of the individual logic block circuits is such as to produce the logic "and/or" function. Three logic block circuits 30–1, 30–2 and 30–3 are shown receiving pulses from generators 18–1, 18–2 and 18–3 spaced angularly about the shaft 27 so pulses are generated as the arm 26 passes them at different times in an operating cycle. The generators are connected through a common conductor 32 to the junction point 22 and to an "or" output terminal 33. The blocks have selectively operated input data switches 4–1, 4–2 and 4–3 controlled by separate cam elements 6–1, 6–2 and 6–3, and each switch is connected to the potential source 3. The "and" output terminals for the interconnected logic blocks are designated 15–1, 15–2 and 15–3.

For ease in explanation, reference will only be made to logic block 30–1 along with its associated inputs and outputs. It should be understood that logic blocks 30–2 and 30–3 operate in the same manner. When either switch 4–1 is closed or a pulse 28 is produced at generator 18–1, only one input is provided to the logic block 30–1. The transistor will be non-conducting under these conditions and a negative level will be available at the output terminal 15–1. There will be no signal at output terminal 33. When, however, the logic block 30–1 receives simultaneously an input data signal through the switch 4–1 and a pulse 28 from the generator 18–1, the transistor will saturate and an essentially ground signal will be available at the "and" output terminal 15–1. As the transistor becomes conductive, a positive pulse will appear at the "or" output terminal 33. This "or" output, placed in its proper time sequence, will indicate which of the logic blocks was conductive. In this way, the "or" function of all the individual logic block outputs will be available at the output terminal 33. It will be understood that any number of logic blocks may be connected in the system as long as each is provided with its own pulse generator which operates to produce a pulse at a different time in the cycle of operation.

While the invention has been particularly shown and described with reference to a preferred embodiment thereof, it will be understood by those skilled in the art that various changes in form and detail may be made therein without departing from the spirit of the invention. It is the intention therefore to be limited only as to the scope of the following claims.

What I claim is:

1. A switching system comprising, in combination, a plurality of logic circuits adapted to produce similar logic functions, a common input potential source for said logic circuits, means including a switch for connecting each of said logic circuits to said input source, an output terminal for each of said logic circuits, a magnetic pulse generator associated with each of said logic circuits, a source of bias potential, means connecting one side of each of said pulse generators to said bias potential and connecting the other side to the logic circuit with which it is associated, a common output terminal connected to the bias side of said pulse generators, and an element movable past said generators in series for producing a series of pulses, said system operating on the production of a pulse by any one of said generators while the logic circuit associated therewith is connected to said input source for producing an output signal at the output terminal of said logic circuit and another output signal at said common output terminal.

2. A switching system comprising, in combination, a plurality of logic circuits, each comprising a transistor having emitter, collector and base electrodes, an input potential source, means including a switch for connecting said emitter electrode of each transistor to said potential source, an output terminal connected to said collector electrode of each of said transistors, means for subjecting said base electrodes of said transistors serially to a magnetic pulse, said last mentioned means comprising a permanent magnet associated with each of said transistors, a wire having turns surrounding each of said permanent magnets, means connecting one end of said wire for each magnet to a bias potential source, means connecting the other end of said wire for each magnet to said base electrode of the transistor with which said magnet is associated, an element of magnetic material movable serially past said magnets for generating pulses serially in said wires, and a common output terminal connected to said wires between said magnets and said bias potential source, each of said transistors operating to produce an "and" logic signal at its output terminal when its emitter electrode is connected to said input potential source and a magnetic pulse is applied to its base electrode, and said pulse generating means operating to produce an "or" signal at said common output terminal when an "and" signal is produced at any one of said transistor output terminals.

3. A circuit comprising an active element having a current emitting electrode, a current collecting electrode, and a control electrode therebetween, a unidirectional element connected between said current emitting electrode and ground and being poled to conduct in response to a predetermined polarity of potential at said current emitting electrode, an inductive element having one end connected to said control electrode and means for inducing a potential in said inductive element and having said one end at a polarity opposite to said predetermined polarity, whereby the application of a potential bias to said current collecting and said current emitting electrodes opposite to said predetermined polarity with respect to said control electdode and greater in absolute magnitude than the absolute magnitude of potential induced in said inductive element superimposed on the potential bias, renders the circuit unresponsive to said induced potentials and whereby application of said predetermined potential to said current emitting electrode is effective to ground the same to render said circuit responsive to said induced potentials to cause said active circuit element to conduct and produce pulses of said predetermined polarity at said output electrode and the other end of said inductive element.

4. A logic circuit comprising, in combination, a transistor having emitter, collector and base electrodes, a data signal input, means selectively connecting said data signal to said emitter electrode so as to condition or prime said transistor for operation, a magnetic pulse generator, means connecting said generator to said base electrode so as to make said transistor operative upon generation of a pulse when said transistor is conditioned or primed, said transistor remaining inoperative when subjected either to said data signal or said generated pulse alone, and an output terminal connected to said collector electrode, said transistor operating to produce an "and" logic signal at said output terminal when subjected simultaneously to a data signal and a generated pulse, means connecting said emitter electrode through a diode to ground, means connecting said collector electrode through a resistor to a source of negative potential, and means connecting said source of negative potential through a resistor to said emitter electrode.

5. A logic circuit comprising in combination, a transistor having emitter, collector and base electrodes, a data signal input including means for selectively, effectively clamping said emitter electrode to ground potential or applying thereto a direct potential of a predetermined polarity with respect to said base tending to render said transistor nonconductive, a magnetic pulse generator having a permanent magnet, a wire having turns surrounding said permanent magnet, means connecting one end of said wire to a bias potential source of a polarity opposite to said predetermined polarity and connecting its other end to said base electrode, and element of magnetic material movable across said permanent magnet adjacent one end thereof for inducing a potential pulse in said wire and being of said predetermined polarity at said other end, a condenser connected across said turns of wire for shaping said pulse, said transistor remaining nonconductive in response to either the clamping of said emitter electrode to ground or to the application of said pulse of said predetermined polarity to said base electrode whereby in response to the simultaneous application of a data signal to said emitter and a pulse by said magnetic pulse generator to said base an output potential is derived from the collector electrode of said transistor and of said one end of said wire surrounding said permanent magnet.

References Cited in the file of this patent

UNITED STATES PATENTS

| | | |
|---|---|---|
| 2,430,379 | Wall | Nov. 4, 1947 |
| 2,602,149 | Brunelle et al. | July 1, 1952 |
| 2,662,175 | Staal | Dec. 8, 1953 |
| 2,852,588 | Hartman | Sept. 16, 1958 |
| 2,853,632 | Gray | Sept. 23, 1958 |
| 2,927,733 | Campbell | Mar. 8, 1960 |
| 2,995,664 | Deuitch | Aug. 8, 1961 |